United States Patent
Wang et al.

(10) Patent No.: US 9,466,789 B2
(45) Date of Patent: Oct. 11, 2016

(54) METHOD OF MAKING A HIGH THERMAL STABILITY REFERENCE STRUCTURE WITH OUT-OF-PLANE ANISOTROPY FOR MAGNETIC DEVICE APPLICATIONS

(71) Applicant: Headway Technologies, Inc., Milpitas, CA (US)

(72) Inventors: Yu-Jen Wang, San Jose, CA (US); Witold Kula, Gilroy, CA (US); Ru-Ying Tong, Los Gatos, CA (US); Guenole Jan, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/511,273

(22) Filed: Oct. 10, 2014

(65) Prior Publication Data
US 2015/0056368 A1    Feb. 26, 2015

Related U.S. Application Data

(62) Division of application No. 13/406,972, filed on Feb. 28, 2012, now Pat. No. 8,871,365.

(51) Int. Cl.
| | |
|---|---|
| *H01L 43/12* | (2006.01) |
| *G01R 33/09* | (2006.01) |
| *G11B 5/39* | (2006.01) |

(Continued)

(52) U.S. Cl.
CPC ............ *H01L 43/12* (2013.01); *G01R 33/093* (2013.01); *G11B 5/3906* (2013.01); *G11B 5/3909* (2013.01); *G11B 5/3929* (2013.01); *G11B 5/66* (2013.01); *G11B 5/84* (2013.01); *G11C 11/15* (2013.01); *G11C 11/161* (2013.01); *H01F 10/3272* (2013.01); *H01F 10/3286* (2013.01); *H01F 10/3295* (2013.01); *H01F 41/305* (2013.01); *H01L 43/02* (2013.01); *H01L 43/08* (2013.01); *H01L 43/10* (2013.01); *H01F 10/123* (2013.01); *Y10T 428/1107* (2015.01); *Y10T 428/1121* (2015.01); *Y10T 428/1143* (2015.01)

(58) Field of Classification Search
None
See application file for complete search history.

(56) References Cited

U.S. PATENT DOCUMENTS

| | | | |
|---|---|---|---|
| 8,541,855 B2 | 9/2013 | Jan et al. | |
| 9,252,710 B2 * | 2/2016 | Wang | H01F 10/3272 |

(Continued)

FOREIGN PATENT DOCUMENTS

| | | |
|---|---|---|
| EP | 13754577.8 | 1/2016 |
| WO | PCT/US2013/022877 | 4/2013 |

*Primary Examiner* — Kevin Bernatz
(74) *Attorney, Agent, or Firm* — Saile Ackerman LLC; Stephen B. Ackerman

(57) ABSTRACT

Enhanced Hc and Hk in addition to higher thermal stability to 400° C. are achieved in magnetic devices by adding dusting layers on top and bottom surfaces of a spacer in a synthetic antiferromagnetic (SAF) structure to give a RL1/DL1/spacer/DL2/RL2 reference layer configuration where RL1 and RL2 layers exhibit perpendicular magnetic anisotropy (PMA), the spacer induces antiferromagnetic coupling between RL1 and RL2, and DL1 and DL2 are dusting layers that enhance PMA. Dusting layers are deposited at room temperature to 400° C. RL1 and RL2 layers are selected from laminates such as (Ni/Co)n, $L1_0$ alloys, or rare earth-transition metal alloys. The reference layer may be incorporated in STT-MRAM memory elements or in spintronic devices including a spin transfer oscillator. A transition layer such as CoFeB/Co may be formed between the RL2 reference layer and tunnel barrier layer in a bottom spin valve design.

19 Claims, 4 Drawing Sheets

(51) Int. Cl.
　　*G11B 5/66*　　　(2006.01)
　　*G11B 5/84*　　　(2006.01)
　　*G11C 11/15*　　(2006.01)
　　*G11C 11/16*　　(2006.01)
　　*H01F 10/32*　　(2006.01)
　　*H01F 41/30*　　(2006.01)
　　*H01L 43/02*　　(2006.01)
　　*H01L 43/08*　　(2006.01)
　　*H01L 43/10*　　(2006.01)
　　*H01F 10/12*　　(2006.01)

(56) References Cited

U.S. PATENT DOCUMENTS

| | | |
|---|---|---|
| 2005/0164414 A1 | 7/2005 | Deak |
| 2006/0209473 A1 | 9/2006 | Oshima et al. |
| 2007/0183187 A1 | 8/2007 | Guo |
| 2007/0243639 A1 | 10/2007 | Pietambaram et al. |
| 2009/0021869 A1 | 1/2009 | Kamiguchi et al. |
| 2009/0257151 A1 | 10/2009 | Zhang et al. |
| 2010/0109110 A1 | 5/2010 | Wang et al. |
| 2011/0293967 A1 | 12/2011 | Zhang et al. |

* cited by examiner

METHOD OF MAKING A HIGH THERMAL STABILITY REFERENCE STRUCTURE WITH OUT-OF-PLANE ANISOTROPY FOR MAGNETIC DEVICE APPLICATIONS

This is a Divisional application of U.S. patent application Ser. No. 13/406,972, filed on Feb. 28, 2012, which is herein incorporated by reference in its entirety, and assigned to a common assignee.

RELATED PATENT APPLICATION

This application is related to the U.S. Pat. No. 8,541,855; assigned to a common assignee and herein incorporated by reference in its entirety.

TECHNICAL FIELD

The present disclosure relates to a magnetic devices that utilize thin films with perpendicular magnetic anisotropy (PMA) and a method for making the same, and in particular, to increasing Hc and thermal stability in the resulting multilayer magnetic stack to survive high temperature semiconductor processes up to 400° C. or higher.

BACKGROUND

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale. J-G. Zhu et al. has described another spintronic device called a spin transfer oscillator (STO) in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry. The STO comprises a stack including a spin injection layer (SIL) with PMA character, an oscillating field generation layer (FGL) with in-plane anisotropy, and a spacer between the SIL and FGL.

Both MRAM and STT-MRAM may have a MTJ element based on a tunneling magneto-resistance (TMR) effect wherein a stack of layers has a configuration in which two ferromagnetic layers typically referred to as a reference layer and free layer are separated by a thin non-magnetic dielectric layer. The MTJ element is typically formed between a bottom electrode such as a first conductive line and a top electrode which is a second conductive line at locations where the top electrode crosses over the bottom electrode in a MRAM device. In another aspect, a MTJ element in a read head sensor may be based on a giant magnetoresistance (GMR) effect that relates to a spin valve structure where a reference layer and free layer are separated by a metal spacer. In sensor structures, the MTJ is formed between two shields and there is a hard bias layer adjacent to the MTJ element to provide longitudinal biasing for stabilizing the free layer magnetization.

A high performance MRAM MTJ element is characterized by a high tunneling magnetoresistive (TMR) ratio which is dR/R where R is the minimum resistance of the MTJ element and dR is the change in resistance observed by changing the magnetic state of the free layer. For Spin-MRAM (STT-MRAM), high anisotropy and greater thermal stability is achieved with a high Hc and high energy barrier $Eb=KuV/K_BT$ where Ku is the magnetic anisotropy, V is the switching magnetic volume, $K_B$ is the Boltzmann constant, and T is the measurement temperature. Furthermore, a high TMR ratio and resistance uniformity Rp_(cov), and a low switching current are desirable.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement and have a low switching current density but also have no limit of cell aspect ratio. As a result, spin valve structures based on PMA are capable of scaling for higher packing density which is one of the key challenges for future MRAM applications and other spintronic devices. Theoretical expressions predict that perpendicular magnetic devices have the potential to achieve a switching current lower than that of in-plane magnetic devices with the same magnetic anisotropy field according to S. Magnin et al. in Nat. Mater. 5, 210 (2006).

When the size of a memory cell is reduced, much larger magnetic anisotropy is required because the thermal stability factor is proportional to the volume of the memory cell. Generally, PMA materials have magnetic anisotropy larger than that of conventional in-plane soft magnetic materials which utilize shape anisotropy. Thus, magnetic devices with PMA are advantageous for achieving a low switching current and high thermal stability. For spin torque applications, a reference layer with high Hc and low stray field is required. Preferably, a synthetic antiferromagnetic (SAF) reference layer is employed with a coupling layer (spacer) formed between two ferromagnetic layers (RL1 and RL2) having PMA in opposite directions. Several PMA material systems for RL1 and RL2 have been reported and include various ordered (i.e. L10) alloys, unordered alloys, and laminates represented by (Pt/Fe)n, (Pd/Co)n, (Ni/Co)n, and the like, where n is the lamination number. Magnetization direction for RL1 and RL2 is anti-parallel due to the RKKY coupling through the spacer layer which is typically Ru or Cu. However, there is a big challenge to increase the RKKY (anti-ferromagnetic) coupling strength to enhance magnetic stability and thermal stability of the reference layer to be compatible with semiconductor processes that reach as high as 400° C. or higher. Note that a higher annealing temperature of >350° C. is also useful in achieving an enhanced TMR ratio.

None of existing technology is known to provide high Hc and thermal stability in a PMA layer that will withstand high temperature processing up to 400° C. or greater which is required in semiconductor fabrication methods. Therefore, a low cost multilayer with high PMA, high Hc, and improved thermal stability is needed to enable PMA materials to be more widely accepted in a variety of magnetic device applications.

SUMMARY

One objective of the present disclosure is to provide a multilayer MTJ stack in a magnetic device that has a Hc value greater than about 300 Oe after high temperature annealing to at least 400° C., and a high magnetoresistance and thermal stability factor (Δ) that is suitable for spintronic applications such as spin-torque MRAM (STT-MRAM), and microwave assisted magnetic recording (MAMR).

A second objective of the present disclosure is to provide a MTJ element with at least a reference layer and/or free layer having a SAF configuration and with high PMA that satisfies the first objective.

According to one embodiment of the present disclosure, these objectives are achieved by sequentially forming an underlayer (seed layer) and a composite reference layer on a substrate wherein the reference layer has a RL1/dusting layer 1/spacer/dusting layer 2/RL2 configuration in which the RL1 and RL2 ferromagnetic layers have PMA character, the spacer is Ru, Cu, Cr, or other metals that induce RKKY or antiferromagnetic (AFM) coupling between RL1 and RL2 layers, and the dusting layers enhance the RKKY coupling. The seed layer may be NiCr, Pd, Pt, Ta, Ru, or other materials that maintain or enhance PMA in an overlying RL1 layer. In one aspect, RL1 and RL2 are laminates such as (Ni/Co)n, (Pt/Co)n, (Pd/Co)n, and the like where n is the lamination number which is from 2 to 30, and preferably 4 to 10. However, Co may be replaced by a Co-based alloy such as $Co_xFe_y$ or $Co_xFe_yB_z$ wherein x>y, and x>z, and Ni may be replaced by a Ni rich alloy such as NiFe or NiFeB. In an alternative embodiment, RL1 and RL2 are $L1_0$ ordered alloys including FePt, CoPt, and FePd. In yet another embodiment, RL1 and RL2 may be rare earth-transition metal (RE-TM) films such as TbFeCo, GdFeCo, and the like. A key feature is the dusting layer formed on top and bottom surfaces of the middle coupling layer. The dusting layer may be Co or an alloy thereof such as CoFe with a thickness between 1 and 50 Angstroms, and preferably from 1 to 10 Angstroms. The dusting layers may be deposited at room temperature or at elevated temperature up to 400° C.

Subsequently, annealing up to 400° C. or higher, and preferably 350° C., may be employed to further improve PMA properties and thereby increase Hc and Hk.

In a first embodiment that represents a bottom spin valve configuration, a seed layer, reference layer, tunnel barrier layer, free layer, and cap layer are sequentially formed on a substrate. The reference layer may have a RL1/DL1/spacer/DL2/RL2 configuration wherein RL1 and RL2 have a laminated structure, $L1_0$ ordered composition, or are made of a RE-TM film as described previously, and DL1 and DL2 are dusting layers. In one aspect, the bottom spin valve configuration is a MTJ structure formed in a STT-MRAM. The free layer may have in-plane magnetization and serve as the field generation layer (FGL) in a MAMR structure while the RL1/DL1/spacer/DL2/RL2 reference layer functions as a spin injection layer (SIL) in a STO embodiment with a seed layer/SIL/non-magnetic spacer/FGL/cap layer configuration. The present disclosure also encompasses an embodiment where both of the reference layer and free layer have a SAF configuration represented by RL1/DL1/spacer/DL2/RL2, and FL1/DL5/spacer/DL6/FL2, respectively, where FL1 and FL2 have PMA and are RKKY coupled through a spacer sandwiched between DL5 and DL6 dusting layers.

In another embodiment, the MTJ element has a top spin valve configuration in a STT-MRAM scheme represented by seed layer/free layer/tunnel barrier/reference layer/cap layer. In either bottom or top spin valve structures, the reference layer may have a dual SAF configuration that is represented by RL1/DL1/spacer/DL2/RL2/DL3/spacer 2/DL4/RL3.

According to a third embodiment, there may be a transitional layer made of CoFeB/Co or the like inserted between the reference layer and tunnel barrier layer to improve magnetoresistance in the MTJ.

In all embodiments, we observe that a substantial coercivity (Hc) and RKKY exchange coupling strength is maintained even after annealing at 400° C. for one hour. The dual SAF structure is believed to further improve Hc and thermal stability in the multilayer MTJ stack.

DETAILED DESCRIPTION

The present disclosure is a multilayer stack with perpendicular magnetic anisotropy that may be employed as a reference layer, free layer, or dipole layer in magnetic devices such as MRAM and STT-MRAM, in spintronic devices such as MAMR, in various designs of PMA spin valves including MTJ elements, and in PMA magnetic media used in magnetic sensors and data storage. The multilayer stack may be used in devices based on bottom spin valve, top spin valve, or dual spin valve designs as appreciated by those skilled in the art.

Figure 1:
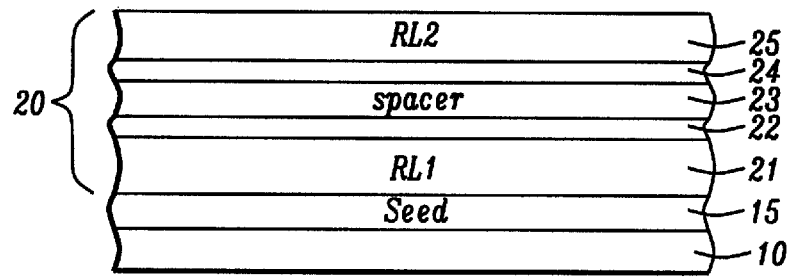
FIG. 1 is a cross-sectional view of a composite reference layer having a RL1/DL1/spacer/DL2/RL2 configuration formed according to an embodiment of the present disclosure.

Referring to FIG. 1, a reference layer 20 with a RL1/DL1/spacer/DL2/RL2 configuration according to a first embodiment of the present disclosure is formed on an underlayer also referred to as seed layer 15 that has been deposited on a substrate 10. Reference layer 20 may also be referred to as a reference layer stack and includes RL1 layer 21 and RL2 layer 25 as lower and upper PMA layers, respectively, a spacer 23 that induces RKKY coupling between the RL1 and RL2 layers, and dusting layers DL1 22, DL2 24 which enhance the RKKY coupling between RL1 and RL2 layers. Layers 21-25 may be sequentially sputter deposited on the seed layer. The substrate may be a bottom electrode in a MRAM, STT-MRAM, or STO, or a bottom shield in a sensor, for example. A seed layer 15 is selected that maintains or enhances PMA Hc and Hk in RL1 layer 21. The seed layer material may be NiCr as disclosed in related patent application Ser. No. 13/068,398, or Pd, Pt, Ta, Ru or other metals or alloys that maintain or enhance the PMA character of RL1.

The RL1 and RL2 layers 21, 25 may be a laminated structure such as (Co/Ni)n, (Co/Pd)n, (Co/Pt)n, or other laminated stacks exhibiting PMA where n is between 2 and 30, and preferably from 4 to 10. It should be understood that the aforementioned laminated stacks may also be represented by (Ni/Co)n, (Pd/Co)n, and (Pt/Co)n depending on which of the metal layers is deposited first on the seed layer. The present disclosure also anticipates that one or more of the laminated layers may be a Co-based alloy such as CoFe or CoFeB as a replacement for Co, and a Ni-based alloy such as NiCo, NiFe, or NiFeB may be a replacement for Ni. Preferably, the Co-based alloy is Co rich wherein the Co content is >50 atomic %, and the Ni-based alloy is Ni rich wherein the Ni content is >50 atomic %. Thus, (CoFe/Ni)n, (CoFeB/Ni)n, (Co/NiFe)n, (Co/NiFeB)n, and (NiCo/Co)n are alternatives for RL1 and RL2 layers. Typically, the Co or Co alloy layer in the laminates has a thickness between 0.5 and 5 Angstroms while the Pd, Pt, Ni, or Ni alloy layer has a thickness from 2 to 10 Angstroms. Preferably, the Co or Co alloy layer is thinner than the Ni, Ni alloy, Pt, or Pd layer. Note that RL1 and RL2 layers may have the same composition or may be made of different laminated stacks. Furthermore, the number of laminations in the RL1 layer 21 may differ from the number of laminations in the RL2 layer 25.

In another embodiment, RL1 layer 21 and RL2 layer 25 are comprised of $L1_0$ ordered alloys such as FePt, CoPt, FePd, NiPt, FeNi, FeCu, MnAl, MnPt, MnPd, CuAu, and the like that have PMA character. In this case, the RL1 and RL2 layers each have a thickness from 15 to 150 Angstroms. In yet another embodiment, RL1 and RL2 layers may be made of rare earth-transition metal (RE-TM) films including TbFeCo, GdFeCo, and the like that exhibit PMA. It should be understood that the present disclosure also anticipates that one of the RL1 and RL2 layers may be one of the aforementioned laminates, $L1_0$ alloy, or a RE-TM alloy while the other of the RL1 or RL2 layers is another of the laminates, $L1_0$ alloy, or a RE-TM alloy. In other words, RL1 layer 21 may be a laminate such as (Ni/Co)n while RL2 layer 25 is (Pd/Co)n, (Pt/Co)n, a $L1_0$ alloy or RE-TM alloy, for example.

The spacer 23 is one of Ru, Cu, Cr, Rh, Ir, or other metals capable of inducing RKKY coupling between RL1 and RL2 layers 21, 25. Preferably, Ru is selected as the spacer because a higher coupling strength is achieved with a RL1/DL1/Ru/DL2/RL2 combination. According to the present disclosure, the thickness of the metal spacer is between 2 and 20 Angstroms with 4 or 9 Angstroms being preferred since either of these spacer thicknesses will lead to the largest RKKY anti-parallel coupling strength in a RL1/DL1/spacer/DL2/RL2 configuration, especially when DL1 and DL2 are made of Co or an alloy thereof, and RL1 and RL2 have PMA character.

D1 layer 22 and D2 layer 24 are referred to as dusting layers and contact bottom and top surfaces, respectively, of the spacer 23. We have surprisingly found that inserting a dusting layer made of Co or a Co rich alloy such as CoFe, CoTa, CoZr, CoHf, CoMg, or CoNb between the spacer and RL1, and a second dusting layer of Co or a Co rich alloy between the spacer and RL2 layer provides an advantage in substantially enhancing the RKKY coupling strength thereby improving thermal stability of the reference layer 20. A Co rich alloy is defined as one having a Co content of 50 atomic % or greater. Furthermore, a subsequent anneal to at least 400° C., and preferably about 350° C., after all layers in the reference layer stack are deposited may be employed to further improve PMA properties by increasing Hc and Hk. DL1 layer 22 and DL2 layer 24 may be sputter deposited at room temperature (RT) or at elevated temperatures up to 400° C. or even higher. The thickness of each of the DL1 and DL2 dusting layers is between 1 and 50 Angstroms, and preferably between 2 and 15 Angstroms. With dusting layer thicknesses greater than about 15 Angstroms, the pinned (reference) layer has in-plane anisotropy rather than PMA (90 degree angle to plane of layer) or a canted magnetization angle where the magnetic moment is between 0 and 90 degrees with respect to the plane of the reference layer. It should be understood that the present disclosure encompasses an embodiment wherein only one dusting layer 22 or 24 is employed in a reference layer stack. However, those skilled in the art will appreciate there is a substantial benefit in terms of higher RKKY coupling and greater thermal stability when using both dusting layers 22, 24 rather than only one.

Figure 2:
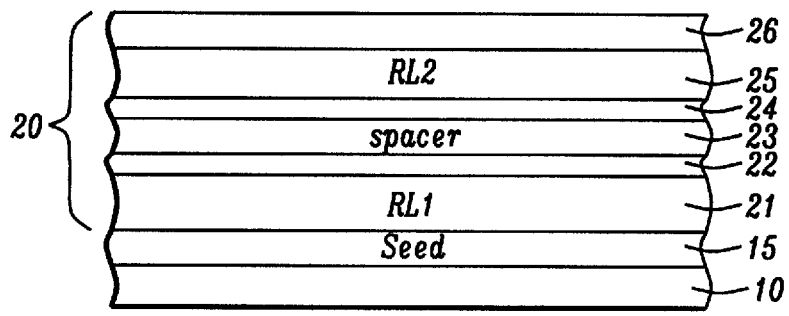
FIG. 2 is a cross-sectional view of the multilayer stack shown in FIG. 1 with a transitional layer formed as the uppermost layer in the reference layer stack according to a second embodiment of the present disclosure.

Referring to FIG. 2, a second embodiment of reference layer 20 is depicted and includes a transitional layer 26 formed as the uppermost layer in the reference layer stack. The transitional layer may be comprised of CoFeB, CoFe, or composites thereof, or with Co such as CoFeB/Co, and is beneficial in magnetic device designs where the reference layer is part of a MTJ and interfaces with a tunnel barrier layer made of an oxide as explained later with regard to FIG. 4. According to one embodiment, the transitional layer is formed between the (111) PMA RL2 layer and a (100) MgO tunnel barrier, and is sufficiently thin to preserve the PMA property of the reference layer 20 and yet thick enough to provide a high magnetoresistance (MR ratio). Thus, in a CoFeB/Co transitional layer 26, the CoFeB portion may be from 4 to 15 Angstroms thick, and preferably 6 Angstroms, while the Co layer portion is from 3 to 8 Angstroms, and preferably 4 Angstroms thick. In one aspect, the CoFeB portion of the transitional layer may have a $Co_{20}Fe_{60}B_{20}$ composition. Note that CoFeB/MgO/CoFeB reference layer/tunnel barrier/free layer configurations are known to yield a high MR ratio. However, Co may be used as the uppermost layer in the reference layer stack and the interface with the tunnel barrier layer since it is more resistant to oxidation than a CoFeB (or CoFe) layer. In other words, in a conventional MTJ it is possible for oxygen to migrate out of a MgO tunnel barrier layer into a reference layer thereby causing partial oxidation of CoFeB or the like, which leads to a degradation in the MR ratio.

Figure 3:
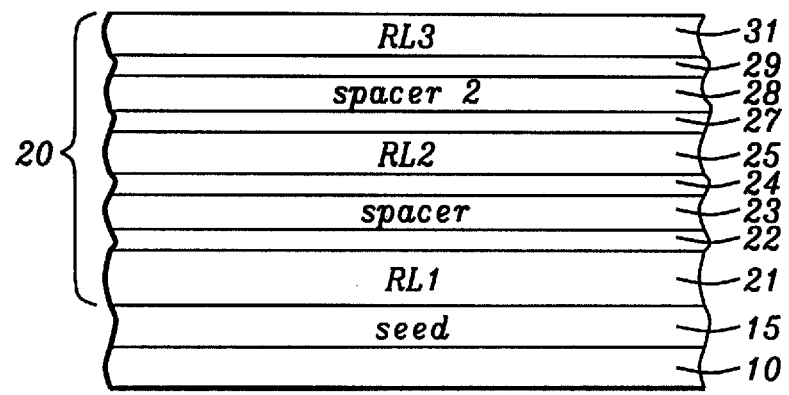
FIG. 3 is a cross-sectional view of a composite reference layer having a dual synthetic antiferromagnetic (SAF) configuration represented by RL1/DL1/spacer/DL2/RL2/DL3/second spacer/DL4/RL3 formed according to a third embodiment of the present disclosure.

Referring to FIG. 3, a third embodiment of the present disclosure is depicted wherein the reference layer has a dual SAF configuration. In this scheme, the SAF configuration in the first embodiment is employed as the bottom portion of the composite reference layer 20. Additional layers including dusting layers DL3, DL4, a second spacer, and a third reference layer RL3 are formed on the RL2 layer to yield a configuration represented by RL1/DL1/spacer/DL2/RL2/DL3/second spacer/DL4/RL3. Thus, DL3 layer 27, second spacer 28, DL4 layer 29, and RL3 layer 31 are sequentially formed on a top surface of the RL2 layer 25. The second spacer 28 may be made of the same material as spacer 23. Furthermore, DL3 and DL4 layers may be comprised of the same materials used for DL1 and DL2 layers, and RL3 layer 31 is selected from the same group of PMA materials as described with respect to RL1 layer 21 and RL2 layer 25. It is believed that the dual SAF reference layer design will further improve thermal stability and Hc of reference layer 20.

Figure 4:
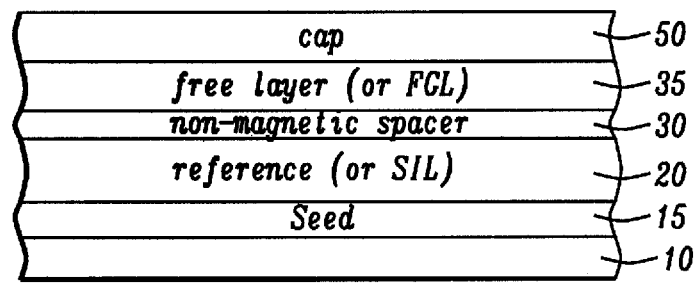
FIG. 4 is a cross-sectional view of a magnetic tunnel junction (MTJ) with a bottom spin valve configuration and containing a RL1/DL1/spacer/DL2/RL2 reference layer formed according to an embodiment of the present disclosure.

Referring to FIG. 4, according to one embodiment of the present disclosure, the reference layer 20 with or without the transitional layer 26 is formed in a MTJ with a bottom spin valve configuration wherein the seed layer 15, reference layer 20, non-magnetic spacer 30, free layer 35, and a cap layer 50 are sequentially formed on substrate 10. In one aspect, the MTJ is part of a MRAM or STT-MRAM structure. For a bottom spin valve design, the resulting MTJ has a seed/RL1/DL1/spacer/DL2/RL2/CoFeB/Co/non-magnetic spacer/free layer/cap layer configuration. Alternatively, the reference layer 20 serves as a spin injection layer and free layer 35 functions as a field generation layer in a STO device. The present disclosure also encompasses an embodiment with a top spin valve structure wherein the free layer 35, non-magnetic spacer 30, reference layer 20, and cap layer 50 are consecutively formed on seed layer 15 (not shown). When the reference layer with a transitional layer 26 is formed in a top spin valve structure, the Co portion of layer 26 contacts the non-magnetic spacer 30 and the CoFeB portion contacts the overlying reference layer to give a seed/free layer/non-magnetic spacer/Co/CoFeB/RL1/DL1/spacer/DL2/RL2/cap layer configuration.

Returning to FIG. 4 and a bottom spin valve structure, the non-magnetic spacer 30 forms a first interface with a top surface of reference layer 20 and a second interface with a bottom surface of the free layer 35. The non-magnetic spacer may be comprised of Cu or another high conductivity metal or metal alloy in a giant magnetoresistance (GMR) embodiment. The present disclosure also anticipates a GMR embodiment having a current confining path (CCP) structure in which a dielectric layer with metal paths therein is sandwiched between two metal layers (i.e. Cu) as appreciated by those skilled in the art. Alternatively, the spacer 30 may be comprised of a dielectric material such as MgO, AlOx, TiOx, ZnO, or other metal oxides or metal nitrides in a tunnel magnetoresistance (TMR) configuration.

In one embodiment, the free layer 35 is a magnetic (ferromagnetic) layer such as CoFeB, CoFe, or combinations thereof having in-plane magnetization or out-of plane magnetization in a MTJ for MRAM or STT-MRAM. However, the free layer may function as a field generation (oscillator) layer having a magnetic moment that is capable of switching from one direction along an easy axis (not shown) to an opposite direction when sufficient spin torque is applied in a STO design.

A cap layer 50 is formed on the free layer 35 and may have a Ru, Ta, Ru/Ta, or Ru/Ta/Ru configuration where the upper Ru layer is used to provide oxidation resistance and excellent electrical contact to an overlying second electrode (not shown) while the lower Ru layer is a barrier that prevents migration of Ta (oxygen gettering layer) into the free layer. Optionally, other capping layer materials used in the art may be selected as the cap layer 50.

Figure 5:
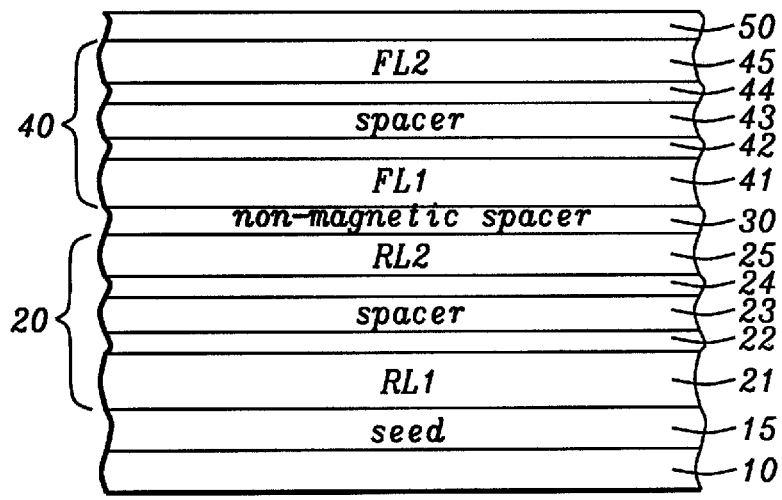
FIG. 5 is a cross-sectional view of a MTJ having a reference layer made of a RL1/DL1/spacer/DL2/RL2 stack and a free layer comprising a FL1/DL3/spacer/DL4/FL2 multilayer stack according to another embodiment of the present disclosure.

According to another embodiment shown in FIG. 5, the reference layer 20 has a multilayer stack with a RL1/DL1/spacer/DL2/RL2 configuration, and the free layer 40 is a second multilayer stack with a FL1/DL5/spacer/DL6/FL2 configuration where FL1 and FL2 are layers exhibiting perpendicular magnetic anisotropy. The spacer between the DL5 and DL6 layers induces RKKY coupling between the FL1 and FL2 layers and may be made of the same material as the spacer 23 between RL1 and RL2 layers. The dusting layers DL5 and DL6 enhance the RKKY coupling between FL1 and FL2 layers and each preferably has a thickness between 2 and 15 Angstroms. In the exemplary embodiment depicting a bottom spin valve structure, the seed layer 15, reference layer 20, non-magnetic spacer 30, free layer 40, and cap layer 50 are sequentially formed on a substrate 10. Free layer 40 comprises FL1 layer 41, DL5 layer 42, spacer 43, DL6 layer 44, and FL2 layer 45 wherein layers 41, 45 may have the same composition as RL1 and RL2 layers in reference layer 20. Therefore, one or both of the FL1 and FL2 layers may have a laminated structure represented by (Ni/Co)m, (Pd/Co)m, (Pt/Co)m, (Ni/CoFe)m, (Ni/CoFeB)m, (NiFe/Co)m, (NiCo/Co)m, or (NiFeB/Co)m. On the other hand, FL1 and FL2 layers may have a different composition and lamination number than that of RL1 and RL2 layers such that the lamination number "m" in the FL1 and FL2 layers is from 2 to 4, and preferably 3. Likewise, DL5 and DL6 layers may differ in composition but are preferably selected from Co, CoFe, or a Co alloy such as CoFeB. The multilayer stack employed as the free layer 40 advantageously reduces the magnetic interaction between free layer and reference layer 20 for minimizing the offset field of the free layer after patterning.

The Ku (anisotropy constant) for the free layer will impact the Eb (energy barrier) of the memory cell and it is believed that the insertion of dusting layers 42, 44 could also increase the PMA Ku of the free layer thereby increasing Eb and enhancing the retention time of STT-MRAM designs. The lamination number "m" in free layer 40 is minimized to between 2 and 4 in order to prevent Ku from becoming too high and requiring a substantially higher write current when switching the free layer.

In one embodiment, the free layer has a (Co/Ni)m/Co/Ru/Co/(Co/Ni)m configuration wherein the number of laminations "m" in the FL1 and FL2 layers is 3 and the Ru spacer thickness is preferably 9 Angstroms thick. Note that a synthetic antiferromagnetic coupling (SAF) structure is used for the free layer so that magnetostatic coupling between the reference layer and free layer will be minimized. As mentioned previously, the RL1 layer 21 may not be the same material as that selected for RL2 layer 25. Likewise, FL1 layer 41 may have a different composition than selected for FL2 layer 45. For example, the FL1 layer may be (Pd/Co)m while the FL2 layer is (Ni/Co)m. According to one aspect of the present disclosure, all DL1, DL2, DL5, and DL6 layers are Co, CoFe, or a Co alloy. However, one or more of the dusting layers 22, 24, 42, 44 may have a composition different from the other dusting layers.

One skilled in the art will also appreciate that the reference layer 20 may have a dual SAF design as described previously in the same spin valve structure with composite free layer 40.

Figure 6:
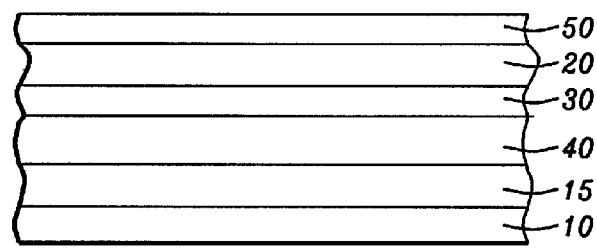
FIG. 6 depicts a cross-sectional view of a top spin valve embodiment.

The present disclosure also anticipates a top spin valve design as depicted in FIG. 6 wherein free layer 40, non-magnetic spacer 30, reference layer 20, and cap layer 50 are consecutively formed on seed layer 15. The resulting MTJ configuration with a single SAF reference layer scheme is represented as seed layer/FL1/DL3/spacer/DL4/FL2/non-magnetic spacer/RL1/DL1/spacer/DL2/RL2/cap layer. Furthermore there may be a transitional layer such as Co/CoFeB inserted between the non-magnetic spacer and RL1 layer as described previously.

Once all of the layers in the one or more multilayer stacks and MTJ are formed, an annealing process may be performed that is comprised of a temperature between 200° C. and 500° C., and preferably between 300° C. and 400° C., for a period of 1 minute to 10 hours. Thereafter, the spin valve structure may be patterned to form a plurality of MRAM (or STT-MRAM) memory cells or STO elements on the substrate 10 by a well known photolithography and etch sequence. In an embodiment where the substrate is a bottom electrode, the bottom electrode is patterned simultaneously with the overlying spin valve stack to enable a higher density of patterned structures for advanced technology designs.

EXAMPLE 1

Figure 7:
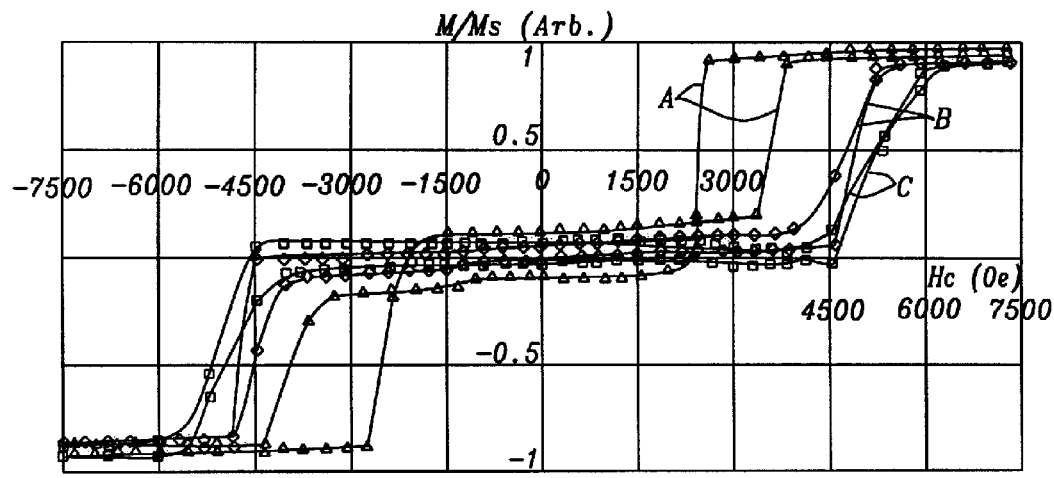
FIG. 7 shows MH loop results for a RL1/spacer/RL2 multilayer configuration (curve A) wherein RL1 is $(Ni/Co)_{12}$, RL2 is $(Co/Ni)_{10}$, and the spacer is Ru, and curve B shows Hc for a RL1/DL1/spacer/DL2/RL2 where RL1 is $(Ni/Co)_{12}$, DL1 and DL2 are Co, RL2 is $(Co/Ni)_{10}$, and the spacer is Ru according to an embodiment of the present disclosure, and curve C shows Hc for a RL1/DL1/spacer/DL2/RL2 stack where DL1 and DL2 are CoFe according to an embodiment of the present disclosure.

To demonstrate the benefits of the present disclosure, unpatterned multilayer stacks were fabricated with and without dusting layers DL1, DL2 described previously. Each multilayer structure has a seed layer/reference layer/cap layer configuration wherein a free layer and non-magnetic spacer have been omitted. In each case, there is a 50 Angstrom thick NiCr seed layer, and a 50 Angstrom thick Ta cap layer. All layers were deposited at RT and annealed at 300° C. for 1 hour. In the (Ni/Co) laminates used for the reference layers, each Co layer is 2.5 Angstroms thick and each Ni layer is 6 Angstroms thick. The Ru spacer is maintained at 4 Angstroms thickness in all examples. Results were obtained by a vibrating sample magnetometer (VSM). FIG. 7 (curve A) shows MH curves for a conventional stack where the RL1/spacer/RL2 reference layer is $(Ni/Co)_{12}/Ru/(Ni/Co)_{10}$. Curves B and C in FIG. 5 show MH loop results for multilayer stacks according to an embodiment of the present disclosure wherein the reference layers are $(Ni/Co)_{12}/Co4/Ru/Co4/(Ni/Co)_{10}$ and $(Ni/Co)_{12}/CoFe4/Ru/CoFe4/(Ni/Co)_{10}$, respectively. In the curve B example, 4 Angstrom thick Co layers are used for DL1 and DL2, and in the curve C example, 4 Angstrom thick $Co_{75}Fe_{25}$ layers are employed for DL1 and DL2.

The MH curves show that the Hc (coercivity) of the reference structure without dusting layers is about 2000 Oe (curve A). Hc is increased to over 4000 Oe by including Co dusting layers (curve B) or CoFe dusting layers (curve C). There is clearly an improved perpendicular Hc component in a reference (SAF) structure by adding a dusting layer on top and bottom surfaces of the Ru spacer which confirms an enhanced RKKY coupling strength with the added dusting layers DL1 and DL2.

EXAMPLE 2

Figure 8:
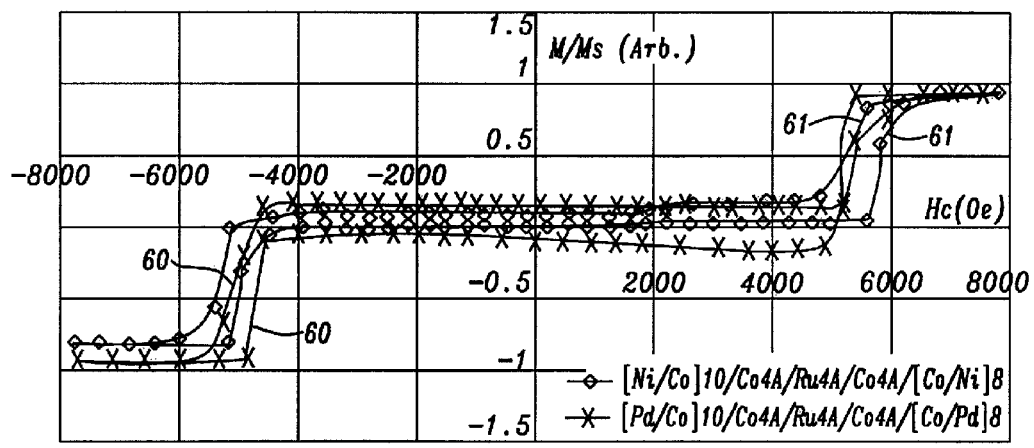
FIG. 8 shows MH loop results with improved Hc for a RL1/DL1/spacer/DL2/RL2 multilayer stack where RL1 is $(Ni/Co)_{10}$ or $(Pd/Co)_{10}$, DL1 and DL2 are Co, RL2 is $(Co/Ni)_8$, and the spacer is Ru according to an embodiment of the present disclosure.

A second experiment was performed to demonstrate that the dusting layers of the present disclosure are also effective in achieving high Hc for laminated RL1 and RL2 layers other than (Ni/Co)n. Two additional multilayer structures were fabricated similar to those described in Example 1. FIG. 8 (curve 60) shows a MH loop for a stack having a $NiCr/(Ni/Co)_{10}/Co4/Ru/Co4/(Ni/Co)_8/Ta$ configuration wherein the RL1 layer has 10 laminations and the RL2 layer has 8 laminations of (Ni/Co). In FIG. 8 (curve 61), a MH loop is illustrated for a multilayer structure in which the RL1 layer in the multilayer stack related to curve 60 is replaced with a $(Pd/Co)_{10}$ laminate to give a $NiCr/(Pd/Co)_{10}/Co4/Ru/Co4/(Ni/Co)_8/Ta$ configuration. The complete stacks are substrate/NiCr50/(Ni6/Co2.5)x10/Co4/Ru4/Co4/(Co2.5/Ni6)x8/Ta50 and substrate/NiCr50/(Pd8/Co3)x10/Co4/Ru4/Co4/(Co2.5/Ni6)x8/Ta50, respectively. The resulting films have a 4 Angstrom thick Co dusting layer on top and bottom surfaces of a 4 Angstrom thick Ru spacer and both display high coercivity of >4000 Oe and good squareness. It is believed that dusting layers DL1 and DL2 will also be effective in enhancing Hc of PMA reference layers RL1 and RL2 comprised of $L1_0$ phase materials or RE-TM materials as described earlier.

EXAMPLE 3

In a third experiment, a reference layer was fabricated with a CoFeB/Co transitional layer as the uppermost layer in the reference layer stack according to an embodiment mentioned previously. The RL1/DL1/spacer/DL2/RL2 multilayer stack was formed on a $Si/SiO_2$ substrate and is suitable to be used as a reference layer in a MTJ exhibiting PMA in a STT-MRAM device. The test structure also includes a NiCr seed layer, a MgO tunnel barrier, and a Ta cap layer and has the following configuration where the number following each layer is the thickness in Angstroms: $NiCr50/(Co2.5/Ni6)_{10}/Co4/Ru4/Co4/(Co2.5/Ni6)_8/CoFeB6/Co4/MgO11/Ta50$. The transitional layer is thin enough to preserve the PMA property in the reference layer and yet has sufficient thickness to provide high magnetoresistance.

Figure 9:
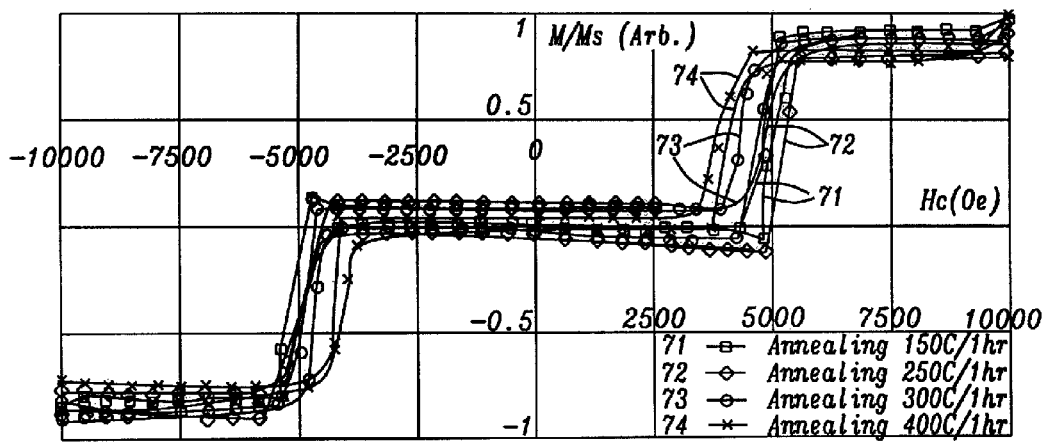
FIG. 9 shows the effect of annealing temperature on the MH loop of a RL1/DL1/spacer/DL2/RL2 stack of the present disclosure with a configuration that is [Ni6A/Co2.5A]10/Co4A/Ru4A/Co4A/[Co2.5A/Ni6A]8/CoFeB6A/Co4A/MgO/Ta.

Annealing was carried out at temperatures from 150° C. to 400° C. for 1 hour and the resulting MH loop results are illustrated in FIG. 9. As indicated by curve 74, high Hc above 3500 Oe can be maintained in the reference layer even after a 400° C. anneal process. There is essentially no change in Hc when comparing annealing at 150° C. to 250° C. (curve 71 vs. 72). A slight reduction in Hc occurs when the annealing temperature reaches 300° C. as indicated in curve 73. As a result, the MTJ with a reference layer including dusting layers as described herein will be compatible with high temperature semiconductor back end of line (BEOL) processing, a significant improvement over current MTJ technology. We observed that a conventional reference layer without a dusting layer did not maintain stability after a 400° C. one hour anneal since the Hc was reduced to less than 300 Oe.

The benefits of the present disclosure are an improved PMA (Hc and Hk) for a reference layer in a magnetic device, and improved compatibility with high temperature processing up to at least 400° C. that makes the multilayer stacks described herein suitable for a variety of applications including advanced STT-MRAM devices. Furthermore, a multilayer stack with a dusting layer may be used as a free layer for Ku enhancement and increasing the retention time of the memory cell for STT-MRAM designs.

While this disclosure has been particularly shown and described with reference to, the preferred embodiment thereof, it will be understood by those skilled in the art that various changes in form and details may be made without departing from the spirit and scope of this disclosure.

We claim:
1. A method of forming a magnetic device having high perpendicular magnetic anisotropy (PMA) comprising:
   (a) depositing a seed layer on a substrate;
   (b) forming a reference layer on the seed layer wherein the reference layer has a RL1/DL1/spacer/DL2/RL2 configuration in which the RL1 and RL2 layers exhibit perpendicular magnetic anisotropy, the spacer induces RKKY (antiferromagnetic coupling) between the RL1 and RL2 layers, and DL1 and DL2 are dusting layers which enhance the RKKY coupling between the RL1 and RL2 layers;
(c) forming a CoFeB/Co transitional layer on the RL2 layer;
(d) forming a non-magnetic spacer on the reference layer;
(e) depositing a free layer on the non-magnetic spacer;
(f) depositing a cap layer on the free layer to give a multilayer stack with a seed/reference layer/non-magnetic spacer/free layer/cap layer configuration; and
(g) annealing the multilayer stack.

2. The method of claim 1 wherein the dusting layers are comprised of Co, CoFe, or a Co alloy and are deposited at room temperature or at a temperature up to at least 400° C.

3. The method of claim 1 wherein the annealing step comprises heating the multilayer stack to a temperature between 200° C. and 500° C. for about 1 minute to 10 hours.

4. The method of claim 1 wherein one or both of the RL1 and RL2 layers have a laminated structure represented by (Ni/Co)n, (Pd/Co)n, (Pt/Co)n, (Ni/CoFe)n, (Ni/CoFeB)n, (NiFe/Co)n, (NiFeB/Co)n, or (NiCo/Co)n where n is the number of laminations and n is between about 2 and 30.

5. The method of claim 1 wherein one or more of the RL1 and RL2 layers are a $L1_0$ alloy that is FePt, CoPt, FePd, NiPt, FeNi, FeCu, MnAl, MnPt, MnPd, or CuAu, or are made of a rare earth-transition metal (RE-TM) alloy.

6. The method of claim 1 wherein the free layer is a multilayer stack with a RL3/DL3/spacer/DL4/RL4 configuration in which RL3 and RL4 layers exhibit PMA, the spacer induces RKKY coupling between the RL3 and RL4 layers, and DL3 and DL4 are dusting layers that enhance the RKKY coupling between the RL3 and RL4 layers.

7. A method of forming a magnetic device having high perpendicular magnetic anisotropy (PMA) comprising:
(a) depositing a seed layer on a substrate;
(b) forming a Co/CoFeB transitional layer on the seed layer;
(c) depositing a free layer on the Co/CoFeB transitional layer wherein the free layer contacts the CoFeB layer in the transitional layer;
(d) forming a non-magnetic spacer on the free layer;
(e) forming a reference layer on the non-magnetic spacer wherein the reference layer has a Co/CoFeB/RL1/DL1/spacer/DL2/RL2 configuration in which the RL1 and RL2 layers exhibit perpendicular magnetic anisotropy, Co/CoFeB is a transitional layer, the spacer induces RKKY (antiferromagnetic coupling) between the RL1 and RL2 layers, and DL1 and DL2 are dusting layers which enhance the RKKY coupling between the RL1 and RL2 layers;
(f) depositing a cap layer on the reference layer to give a multilayer stack with a seed layer/free layer/non-magnetic spacer/reference layer/cap layer configuration; and
(g) annealing the multilayer stack.

8. The method of claim 7 wherein the DL1 and DL2 dusting layers are comprised of Co, CoFe, or a Co alloy and are deposited at room temperature or at a temperature up to about 400° C.

9. The method of claim 7 wherein the annealing comprises heating the multilayer stack to a temperature between 200° C. and 500° C. for about 1 minute to 10 hours.

10. The method of claim 7 wherein one or both of the RL1 and RL2 layers have a laminated structure represented by (Ni/Co)n, (Pd/Co)n, (Pt/Co)n, (Ni/CoFe)n, (Ni/CoFeB)n, (NiFe/Co)n, (NiFeB/Co)n, or (NiCo/Co)n where n is the number of laminations and n is between about 2 and 30.

11. The method of claim 7 wherein one or more of the RL1 and RL2 layers are a $L1_0$ alloy that is FePt, CoPt, FePd, NiPt, FeNi, FeCu, MnAl, MnPt, MnPd, or CuAu, or are made of a rare earth-transition metal (RE-TM) alloy.

12. The method of claim 7 wherein the free layer is a multilayer stack with a FL1/DL5/spacer/DL6/FL2 configuration in which FL1 and FL2 layers exhibit PMA, the spacer induces RKKY coupling between the FL1 and FL2 layers, and DL5 and DL6 are dusting layers that enhance the RKKY coupling between the FL1 and FL2 layers.

13. A method of forming multilayer stack having a thermal stability to at least 400° C. in a magnetic device, comprising:
(a) depositing a seed layer on a substrate; and
(b) forming a composite reference layer on the seed layer, comprising:
(1) a first reference (RL1) layer and a second reference (RL2) layer each exhibiting perpendicular magnetic anisotropy wherein the RL1 and RL2 layers are made of a laminate that is (Ni/CoFe)n, (Ni/CoFeB)n, (NiFe/Co)n, (NiFeB/Co)n, or (NiCo/Co)n where n is the number of laminations;
(2) a spacer that induces RKKY (antiferromagnetic) coupling between the RL1 and RL2 layers;
(3) a first dusting layer (DL1) and a second dusting layer (DL2) that enhance the RKKY coupling between the RL1 and RL2 layers; and
(4) a CoFeB/Co transitional layer such that the multilayer stack has a RL1/DL1/spacer/DL2/RL2/CoFeB/Co configuration.

14. The method of claim 13 wherein the spacer is Ru, Rh, Ir, Cu, or Cr and has a thickness from about 2 to 20 Angstroms.

15. The method of claim 13 wherein n is from about 2 to 30.

16. The method of claim 13 wherein the DL1 and DL2 dusting layers are made of Co, CoFe, or a Co alloy.

17. The method of claim 13 wherein the seed layer is comprised of NiCr, Ta, Pd, Pt, or Ru.

18. The method of claim 13 further comprised of forming a free layer, and a non-magnetic second spacer that is formed between the free layer and the RL2 layer.

19. The method of claim 18 wherein the free layer has a second multilayer stack with a FL1/DL5/third spacer/DL6/FL2 configuration wherein FL1 and FL2 are ferromagnetic layers that exhibit PMA, the third spacer induces RKKY coupling between the FL1 and FL2 layers, and DL5 and DL6 are dusting layers that enhance the RKKY coupling between the FL1 and FL2 layers.

* * * * *